United States Patent [19]

Marshall

[11] 4,359,753

[45] Nov. 16, 1982

[54] MAINTAINING PASCHEN BREAKDOWN VOLTAGE IN ELECTROGRAPHIC PRINTING

[75] Inventor: Richard C. Marshall, Harpenden, England

[73] Assignee: Xerox Corporation, Stamford, Conn.

[21] Appl. No.: 103,991

[22] Filed: Dec. 17, 1979

[30] Foreign Application Priority Data

Dec. 21, 1978 [GB] United Kingdom ............... 49531/78

[51] Int. Cl.³ .............................................. G11B 15/60
[52] U.S. Cl. ................................. 346/153.1; 346/150; 430/35; 355/14 CH
[58] Field of Search ...................... 346/1.1, 150, 153.1, 346/159; 101/DIG. 13; 355/3 CH, 14 CH; 427/13, 26, 38; 430/31, 35, 48, 53; 250/315.1, 325; 324/79 R, 113

[56] References Cited

U.S. PATENT DOCUMENTS 3,179,944  4/1965  Dickens ............................ 346/159 X
4,139,816  2/1979  Sanford ............................ 324/113 X
4,297,715  10/1981 Tadauchi et al. .................. 346/150

FOREIGN PATENT DOCUMENTS 1448908 12/1968 Fed. Rep. of Germany .
2632929  1/1978 Fed. Rep. of Germany .

*Primary Examiner*—Stuart N. Hecker
*Attorney, Agent, or Firm*—W. Douglas Carothers, Jr.

[57] ABSTRACT

In electrographic printing Paschen breakdown must be exceeded for writing to occur, or the Paschen breakdown level can be used as a measure of the suitability of record media for use in such printing. The onset of Paschen breakdown is determined by the appearance or disappearance of second harmonic current flow across a test gap. The DC output of an integrator rises until the onset of Paschen breakdown occurs caused by the combination of the D C output and a sinusoidal voltage from an oscillator.

8 Claims, 6 Drawing Figures

MAINTAINING PASCHEN BREAKDOWN VOLTAGE IN ELECTROGRAPHIC PRINTING

BACKGROUND OF THE INVENTION

1. Field of the Invention

The invention relates to electrographic printing.

In electrographic printing it is usual to have a plurality of exposed styli and to move a recording medium past the exposed styli. The record medium is conventionally a conductive material having a dielectrically coated surface which is presented to the styli as the record medium moves past the head. The head is responsive to input signals and arranged to select individual styli or groups of styli so as to form a surface charge image on the recording medium, which image is later developed elsewhere in the printing system.

2. Description of the Prior Art

In U.S. Pat. No. 3,859,960, selected styli and a backing plate behind the record medium are energised simultaneously with signals of opposite polarity to enable writing. In U.S. Pat. No. 3,611,419, the backing plates are replaced by "front" plates on either side of the stylus array. As in U.S. Pat. No. 3,859,960, the front plates and styli are energised by signals of opposite polarity, on the styli and front plates, and a capacitive coupling is formed with the record medium to enable writing. In both U.S. Pat. No. 3,859,960 and U.S. Pat. No. 3,611,419, it is normally required in practice, to avoid false writing, to energise groups of styli separated by groups of non-energised styli. This is achieved as specifically described in U.S. Pat. No. 3,611,419 by making sure adjacent front plates are not energised simultaneously.

Significant electrical energy is often required to ensure that the required relative potential between styli and record medium is achieved to enable writing by causing ionisation of the gap between the styli and the medium so that the surface charge image can be formed. Ionisation takes place when the potential rises above the "Paschen breakdown voltage".

The "Paschen breakdown voltage" is the voltage at which the insulation of the air breaks down and an avalanche condition ensues allowing ions to flow from the stylus to the record medium. The breakdown voltage varies with the profile of and separation between stylus and record medium and ambient conditions as well as the inherent properties of the record medium.

Normally, the separation of the styli and the record medium is maintained reasonably constant but ambient conditions can vary widely as can the properties of the record medium.

SUMMARY OF THE INVENTION

It is an object of the present invention to provide a method and apparatus for measuring the on-set of Paschen breakdown and the suitability of record media to be used in electrographic printing.

According to one aspect of the invention there is provided a method of determining the applied voltage at which Paschen breakdown occurs for an electrographic printing system comprising applying a sinusoidal voltage across an air-gap between an electrode and a record medium, varying the magnitude of the applied voltage, monitoring said applied voltage to detect the abrupt appearance or disappearance of harmonic currents which takes place at the onset of Paschen breakdown, and measuring the magnitude of said applied voltage corresponding to said abrupt change.

According to another aspect of the invention there is provided an apparatus for determining the applied voltage at which Paschen breakdown occurs for an electrographic printing system including means arranged to apply a sinusoidal voltage across an air-gap between an electrode and a record medium, means for varying the magnitude of the applied voltage, means for monitoring said applied voltage to detect an abrupt appearance or disappearance of harmonic currents which takes place at the onset of Paschen breakdown, and means for measuring the magnitude of said applied voltage corresponding to said abrupt change.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
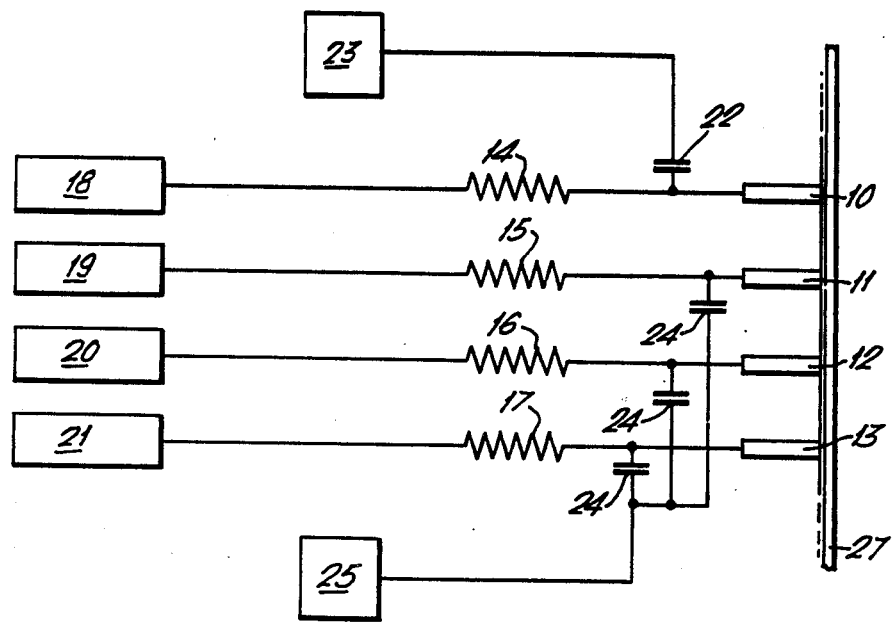
FIG. 1 shows schematically the electrical configuration of an electrographic printing head.

Referring to the drawings, in FIG. 1 a part of a stylus array is shown. The styli 10 to 13 are each connected through respective resistors 14 to 17 to different drive pulse supplies in 18 to 21. The stylus 10 is capacitively coupled to capacitor 22 to drive pulse supply 23 and the styli 11 to 13 are all capacitively coupled by capacitors 24 to drive pulse supply 25. Thus, each stylus is connected to receive drive pulses from two different drive pulse supplies via a resistor and a capacitor respectively.

Figure 2:
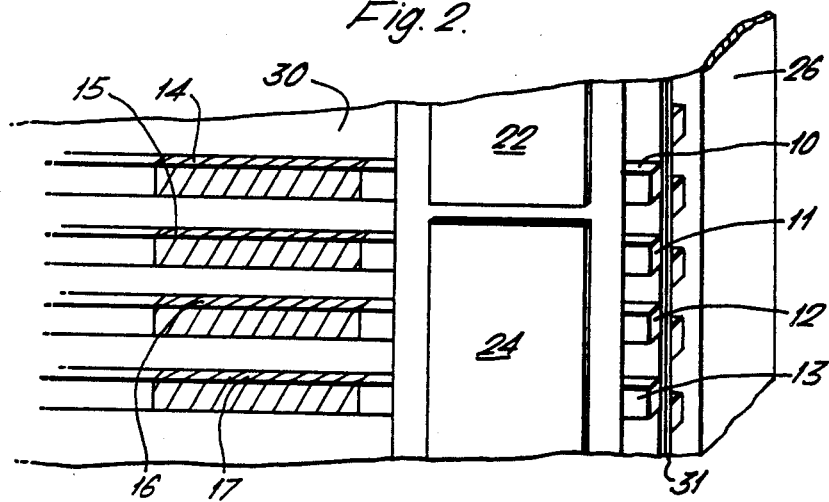
FIG. 2 shows diagrammatically a plan view of the head.

In use, to enable a stylus to write in one configuration it is supplied in sequence with a first drive signal through its resistor and a second drive signal of the same polarity through its capacitor. If the first signal is present, then on application of the second drive signal the voltage at the stylus is raised above the Paschen breakdown voltage so that an electrostatic charge can be applied to a record medium opposite that stylus. One earthing plate 26 is shown in FIG. 2 which contacts the record medium 27 (see FIG. 1) moving past the end of the styli in use to prevent the record medium developing an overall charge potential. In practice, in the configuration shown, we apply a negative potential of around 300 volts as the first drive signal. The second drive signal is also at a negative potential of around 300 volts. It will be appreciated that if only either a first or second drive signal is applied alone to any stylus, the stylus voltage will not go more negative than 300 volts in this case, which is less than the Paschen breakdown voltage for the one configuration.

In the configuration above, writing is achieved by the application of both drive signals. In another configuration writing is prevented by such conditions and writing achieved by the absence of the first drive signal. In this other configuration the threshold is set for example at around −200 volts for the styli and the first drive signal arranged to be at +250 volts, say. Thus, on the application of the first drive signal the potential of the stylus rises to around +250 volts so that the result of applying the second drive signal is to reduce the potential of the stylus to near zero volts. However, in the absence of the first drive signal, the second drive signal causes the potential of the stylus to drop to −250 volts, so that as the Paschen voltage level is −200 volts, in this case writing occurs. It will be noted that this latter Paschen voltage level can be achieved by moving the record medium closer to the stylus than before if possible and/or maintaining the surface of the record medium at a non-zero datum voltage level, of around say +250 volts in this case.

It will be appreciated that other drive signal combinations can be used to control the write and non-write conditions of the styli and that the datum voltage of the record medium adjusted as required. However, in each case the styli are driven by the application or non-application of a first signal applied to the resistive coupling which is then followed by the application of a second drive signal to the capacitor coupling. The sequence of application of first and second drive signals is controlled by conventional logic circuit means.

It will be noted that the choices of the values of the resistive (R) and capacitive couplings (C) represent a compromise. On application of the first signal a finite time rise (or fall as the case may be) can be reduced if the time constant of the RC circuit is kept low enabling the second signal to be applied very soon after the application of the first signal. However, if the time constant is low, on application of the second signal, the voltage pulse at the end of the stylus caused by the second signal will then be very narrow thus causing a very brief voltage excursion through the Paschen breakdown level. By contrast, if the time constant is higher, this Paschen voltage excursion is longer but the second drive signal must be delayed somewhat after the application of the first signal to allow the stylus potential caused thereby to rise or fall to the first signal level. In practice in one arrangement, we use a resistance value of 200 kohms approximately and a capacitive value of 15 picofarads approximately.

Figure 3:
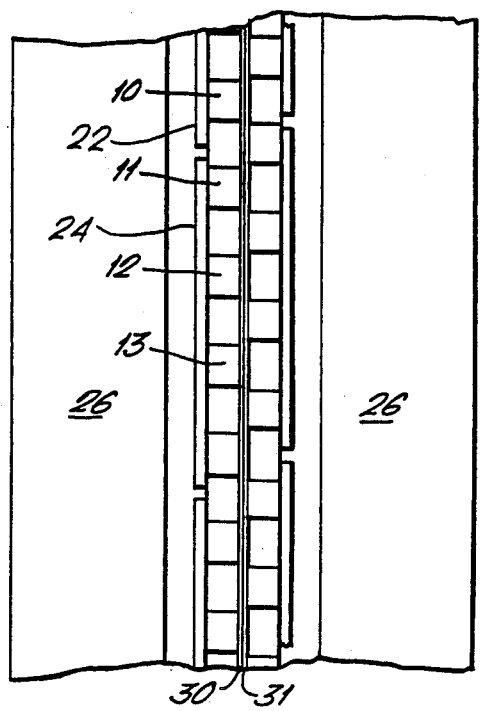
FIG. 3 shows a side view of the head of FIG. 2.
Figure 4:
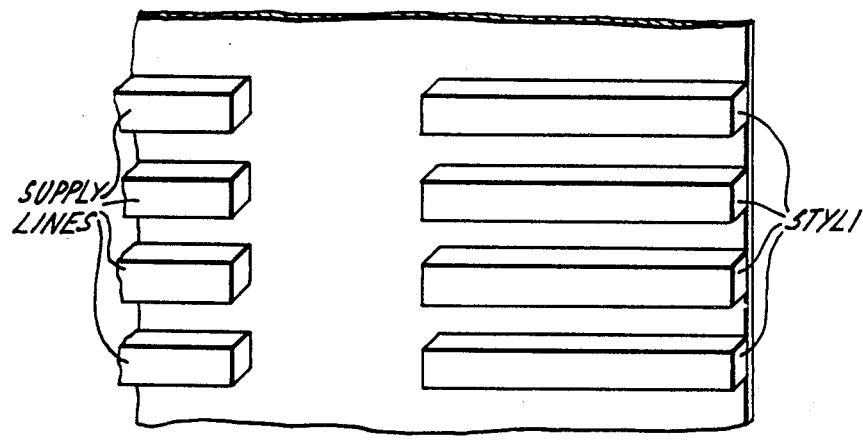
FIG. 4 shows isometrically a block of material from which the head can be formed.

In FIGS. 2 and 3, the styli 10 to 14 are formed of copper plating mounted on a substrate 30. The resistors 14 to 17 are formed of resistance material doped resin mounted on the substrate 30. The capacitors 22 and 24 are provided by a thin epoxy resin sheet fixed on to the stylus head and discrete copper plates or plating mounted on the resin sheet.

A second row of styli are shown fixed to a second substrate 31 and form in effect a mirror image of the first row of styli. The second row of styli are however staggered with respect to the first row of styli to increase the lines per inch of writing, as is known in other stylus head proposals and to fill in gaps between styli of the previous rows to improve print quality. End plates 26 are provided at each side of the pair of stylus arrays. In practice these end plates are usually earthed and engage the surface of the record medium during printing.

It was mentioned in the introduction that the Paschen breakdown level varies and it is necessary that the level is always exceeded whatever the ambient conditions for writing to take place. This can be achieved by raising the potential for writing to such a high level (e.g., when breakdown is expected at 450 volts, 600 volts is applied as described above) that variations in the Paschen breakdown are swamped. However, this means considerably more energy is used than is required. Further, if the printing is required to offer a grey scale, accurate control of the writing potential is essential, and further, the write potential must not be raised to a level such that (in the first example given) the application of either a first or second drive pulse alone is sufficient to cause writing when the Paschen voltage is low. The arrangement of the present invention to be described below enables automatic accurate control of the writing potential to be achieved even if the Paschen breakdown level is varying due to changes in ambient conditions and/or record medium properties.

In this embodiment of the invention a test bar is set up, preferably extending the width of the record medium to be used in the machine, in the general region of the printing head so as to be subjected to the same environment as the head. The test electrode is designed to have as near as possible the same operating characteristics as the printing head so that the ionisation of the gap at the test electrode can be expected to be generally the same as occurs during writing at the head. The test electrode is provided with a test circuit.

Figure 5:
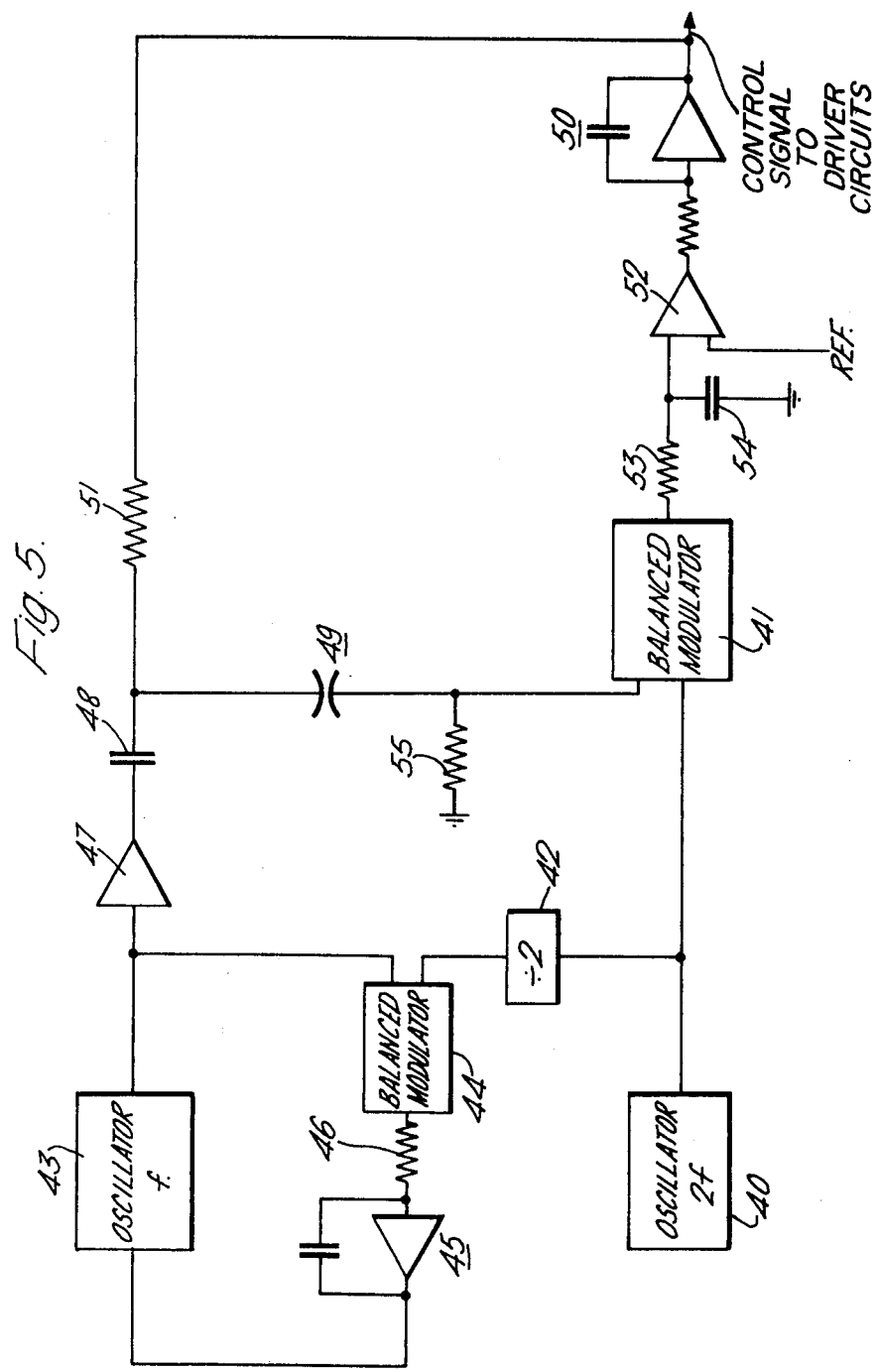
FIG. 5 shows the circuit diagram of a control system for determining the on-set of Paschen breakdown.

In FIG. 5, the test circuit includes an oscillator 40, having a frequency (hereinafter described as '2f') at approximately two times the frequency corresponding to the bit rate at which the writing stylus head is operated, which acts as a reference signal to a phase sensitive detector, ie, a balanced modulator 41, and also supplies a divide-by-two circuit 42. Another oscillator 43, having a natural frequency at the operating frequency, provides a sinusoidal signal which is phase locked to 'f' by the feed-back circuit comprising a balanced modulator 44 supplied from the output of the oscillator 43 and the divide-by-two circuit 42. The modulator 44 supplies an integrating circuit 45 through a resistor 46, whose output adjusts the frequency of oscillator 43 by means of a variable capacitive diode within the oscillator circuit.

The output of the oscillator 43 is supplied through an amplifier 47 and a capacitor 48 to one side of test bars 49. The output of an integrator 50 is also fed to one side of test bars 49 via a resistor 51. The input to the integrator 50 is supplied from a comparator 52 which compares a reference signal with the output of the modulator 41 which is supplied through a low pass filter, consisting of a resistor 53 and capacitor 54. The other side of the test bars 49 is connected to the input side of the modulator 41 where a voltage is developed dependent on the current flowing in a resistor 55.

In use, it is anticipated that Paschen breakdown will occur at around 450 volts so that the voltage developed by the oscillator 43 is arranged to peak at, say, 10 volts. At switch-on, the d.c. voltage at the output of the integrator 50 will rise to some 440 volts, when Paschen breakdown actually takes place whereafter a significant current flows between the test electrodes 49. A harmonic AC voltage is developed by this current which is detected by the phase-sensitive detector 41 and after smoothing by the low pass filter 53 and 54 is compared with the given reference signal. Thus, the threshold of Paschen breakdown is sensed by the abrupt increase in second harmonic current between the test electrodes 49. The action of the comparator 52 is arranged to maintain the output of the integrator 50 to cause Paschen breakdown at or near each peak of the output of the oscillator 43.

It will be noted that an even harmonic frequency is used to monitor Paschen breakdown, because of its marked current change at the moment of breakdown. The second harmonic is the largest such current. Before breakdown, virtually no second harmonic current flows but at the precise onset of breakdown a comparatively large second harmonic current begins to flow.

The output of the integrator 50 represents the DC voltage required to maintain the above-mentioned harmonic current flow between the test bars 49. The output is used as a control signal for the stylus head driver circuits.

The control signal is automatically adjusted to take into account any variations in the record medium dielectric properties and the general ambient conditions, especially humidity, in which the copier is at the time operating. This enables the driver circuit output to be automatically varied so that copy density is maintained automatically in wide ranging operating conditions of the stylus head. Although manual control may provide adjustments in some cases, it is believed particularly useful to have an automatic system of the kind described above where the electrographic copier is expected to provide copies with grey-scale capability, as mentioned earlier, for long periods without intervention by a skilled operator.

It will be appreciated that the circuit of FIG. 5 may also be used to test or calibrate record media for electrographic printing not only for dielectric properties but also for surface smoothness. In this case, the test circuit of FIG. 5 is used to determine whether Paschen breakdown occurs at a specific applied voltage level or within a range of predetermined levels. In this way, a test procedure can be provided either to calibrate record media or as a quality control procedure to accept of reject parts or batches of record media material.

It will be appreciated that the circuit could be arranged to provide initially a higher DC voltage than required for Paschen breakdown so that initially a second harmonic current flows. In this circuit the DC voltage is reduced until the second harmonic current abruptly disappears indicating excursion below the Paschen breakdown voltage level. As before, however, the abrupt change indicates the value of the onset at which conduction across the air-gap would first take place in an electrographic printing head. The measurement is therefore equally valuable in assessing the voltage at which a printing head stylus would cause charge to flow onto a record medium or in another sense the suitability of a record medium under test.

Figure 6:
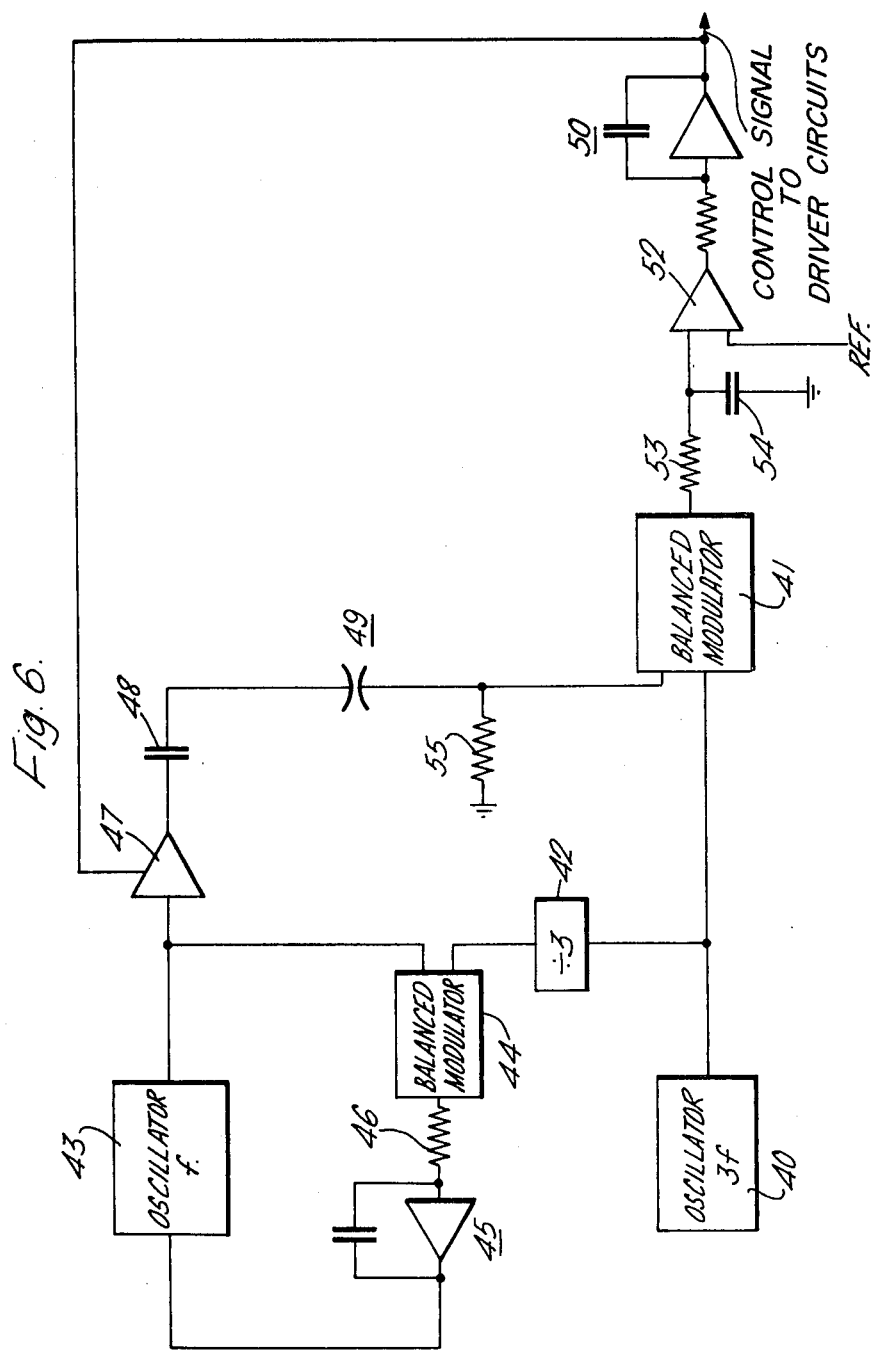
FIG. 6 shows the circuit diagram of a control system similar to the control system of FIG. 5.

In another embodiment, in FIG. 6, Paschen breakdown is measured by detecting harmonic current flow as described above but using a circuit for developing a variable AC voltage across the test electrodes 49 by varying the output of the generator 43 using a signal from the integrator 50. In the other embodiment the output of the generator 43 is increased until the moment of breakdown. In FIG. 6 the oscillator 40 is arranged to oscillate at 3f and the divide circuit 42 is a divide-by-three circuit. The current to be detected at Paschen breakdown is then the third harmonic current.

It would be possible to determine Paschen breakdown by applying a DC voltage alone and increasing that DC voltage until breakdown took place. The embodiments described are preferred because the application of short pulses of current onto the surface of the record medium using the circuit described means that the surface is charged less and so interferes with subsequent printing less. Also, the simulation of more realistic dynamic effects of pulsing tends, we believe, to provide more reliable results in practice.

In the embodiments described with reference to FIGS. 5 and 6, the second and third harmonic currents are monitored to determine the onset of Paschen breakdown respectively. Whether the even or odd harmonic current is chosen depends therefore on the character of the applied voltage across the air-gap. It will be appreciated however that in each case the onset of breakdown provides an abrupt change in the current flow, whether sensed by detecting the moment of the start of flow or the cessation of flow, which makes it possible in the case of the embodiments described to determine accurately the Paschen breakdown voltage level.

While the invention has been particularly described and shown with reference to the preferred embodiments thereof, it will be understood by those skilled in the art that variations and modifications may be made without departing from the spirit and scope of the invention.

What is claimed is:

1. A method for determining the applied voltage required for Paschen breakdown to occur between pairs of writing electrodes in an electrographic printing system for use in maintaining the applied writing voltage at an effective minimum operating level based upon existing environmental and physical conditions of the system, the writing electrodes being electrically addressed with an applied voltage having an operating frequency at the Paschen breakdown voltage to form a latent image on a recording medium moving relative to and adjacent to the electrodes, the voltage at which Paschen breakdown occurs being accompanied by an abrupt change in current flow due to the appearance or disappearance of harmonic currents, the method comprising the steps of providing in said system a set of test electrodes having a test gap adjacent to said recording medium, said test electrodes capable of indicating operating characteristics comparable to the writing electrodes, generating a harmonic signal, said harmonic signal having a frequency that is a multiple integer of said operating frequency, applying a sinusoidal voltage across said test gap at said operating frequency, the applied voltage being initially synchronized relative to said harmonic signal, monitoring the applied sinusoidal voltage across said test gap to detect an abrupt appearance or disappearance of a harmonic current at said test gap corresponding in frequency to said harmonic signal, and measuring the magnitude of the applied sinusoidal voltage corresponding to the amplitude of said harmonic current developed across the test gap at the time of said abrupt change.

2. The method according to claim 1 including the step of utilizing the measured applied sinusoidal voltage magnitude to maintain the peak output voltage of said operating frequency at or near the level at which Paschen breakdown occurs at said test electrodes.

3. The method according to claim 1 wherein the step of applying the sinusoidal voltage comprises the step of simultaneously applying a fixed alternating voltage and a variable direct current voltage.

4. The method according to any one of claims 1, 2 or 3 including the step of monitoring the harmonic current by crosscorrelating the currents developed across said test gap with a sinusoidal signal having a selected frequency that is two or more times the frequency of the applied sinusoidal voltage.

5. An apparatus for determining the applied voltage required for Paschen breakdown to occur between pairs of writing electrodes in an electrographic printing system for use in maintaining the applied writing voltages at an effective minimum operating level based upon existing environmental and physical conditions of the system, the writing electrodes being electrically addressed with an applied voltage having an operating frequency at the Paschen breakdown voltage to form a latent image on a recording medium moving relative to and adjacent to said electrodes, the voltages at which Paschen breakdown occurs being accompanied by an abrupt change in current flow due to the appearance or disappearance of harmonic currents, and comprising a set of test electrodes in said system, said electrodes having a test gap adjacent to said recording medium, said test electrodes capable of indicating operating characteristics comparable to said writing electrodes, means for generating a harmonic signal having a frequency that is a multiple integer of said operating frequency, means coupled to said generating means to apply a sinusoidal voltage across said test gap at said operating frequency and initially synchronized relative to said harmonic signal, means coupled to said generating means for monitoring said applied sinusoidal voltage across said gap to detect an abrupt appearance or disappearance of a harmonic current at said test gap corresponding in frequency to said harmonic signal, and means to measure the magnitude of said applied sinusoidal voltage corresponding to the amplitude of said harmonic current developed across said test gap at the time of said abrupt change.

6. The apparatus of claim 5 including means for developing a control signal from said measuring means corresponding to the value of the applied voltage at Paschen breakdown.

7. In an electrographic printing system including the apparatus according to claim 6, said control signal to be used to control the electrical supply upon electrical addressing of said writing electrodes.

8. The apparatus of claim 6 wherein said developed control signal is utilized to maintain the peak output voltage of said operating frequency at or near the level at which Paschen breakdown occurs at said test electrodes.

* * * * *